Dec. 12, 1944. R. L. FREEMAN Re. 22,576

HIGH-FREQUENCY SIGNAL-TRANSLATING STAGE

Original Filed Oct. 22, 1938 2 Sheets-Sheet 1

INVENTOR
ROBERT L. FREEMAN
BY Lawrence B. Dodds
ATTORNEY

Dec. 12, 1944. R. L. FREEMAN Re. 22,576

HIGH-FREQUENCY SIGNAL-TRANSLATING STAGE

Original Filed Oct. 22, 1938 2 Sheets-Sheet 2

INVENTOR
ROBERT L. FREEMAN
BY Laurence B Dodds
ATTORNEY

Reissued Dec. 12, 1944

Re. 22,576

UNITED STATES PATENT OFFICE 22,576

HIGH-FREQUENCY SIGNAL-TRANSLATING STAGE

Robert L. Freeman, Flushing, N. Y., assignor to Hazeltine Corporation, a corporation of Delaware Original No. 2,188,504, dated January 30, 1940, Serial No. 236,540, October 22, 1938. Application for reissue April 29, 1941, Serial No. 390,971

25 Claims. (Cl. 179—171)

Figure 1:
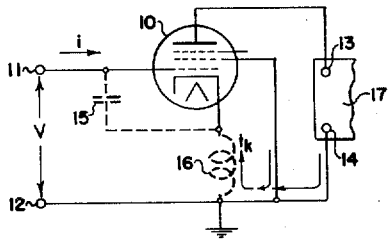

This invention relates generally to high-frequency signal-translating stages and particularly to stages for operation at such high frequencies that the conductance of the input circuit of the stage is an appreciable factor in the response characteristic of the stage.

The input conductance of conventional vacuum tubes utilized in high-frequency translating stages, such as a stage of high-frequency amplification, materially reduces the response of the stage. At frequencies above 10 megacycles or thereabout, the input conductance of a conventional vacuum tube is appreciable and at frequencies higher than 50 megacycles the input conductance rather than the inherent tube and circuit capacitance becomes the limiting factor in the response of the stage. The reason for this condition is that the maximum impedance which can be developed across the input circuit of the stage at these frequencies is limited by the input conductance of the tube.

It is an object of the present invention to provide an improved high-frequency signal-translating stage which is not subject to the above-mentioned disadvantages.

It is a further object of the invention to provide a high-frequency signal-translating stage, the response of which is not substantially limited by the input conductance of the vacuum tubes utilized in the stage.

In accordance with the invention, a high-frequency signal-translating stage comprises a vacuum-tube electrode structure effectively including a plurality of space discharge paths in parallel. Certain of the discharge paths comprise the elements of a conventional vacuum tube including input electrodes having an appreciable positive conductance therebetween. Others of the discharge paths comprise input electrodes including a control electrode and a cathode, together with means for forming a virtual cathode adjacent the control electrode and between the control electrode and the cathode, whereby a negative conductance exists between the input electrodes. The spacing of the electrodes and their normal operating potentials are so proportioned that the above positive and negative conductances are complementary over the operating range of the stage.

In one embodiment of the invention, the two discharge paths may be comprised in separate vacuum tubes. In accordance with the preferred embodiment of the invention, the means for forming the above-mentioned virtual cathode comprises two electrodes between which the negatively biased control electrode associated with the virtual cathode is positioned. Postive potentials are applied to the two above-mentioned electrodes to form the virtual cathode, thereby providing a negative conductance between the control electrode and cathode, that is, between input electrodes of the tube.

In another preferred embodiment of the invention, the two above-mentioned space discharge paths are comprised in the same vacuum tube, the tube having conventional electrodes disposed in one of the space paths and means for forming the above-mentioned virtual cathode disposed in the other of said space paths.

Figure 2:
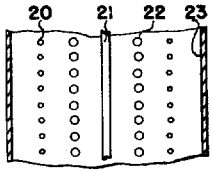
Figure 3:
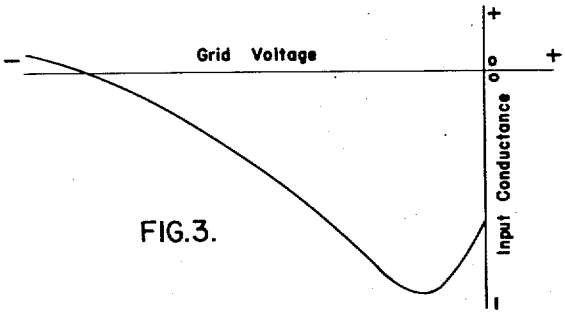
Figure 4:
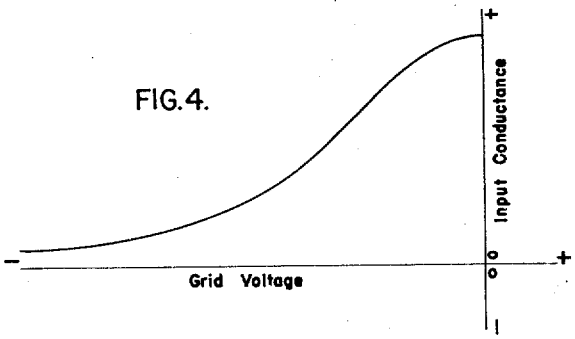
Figure 5:
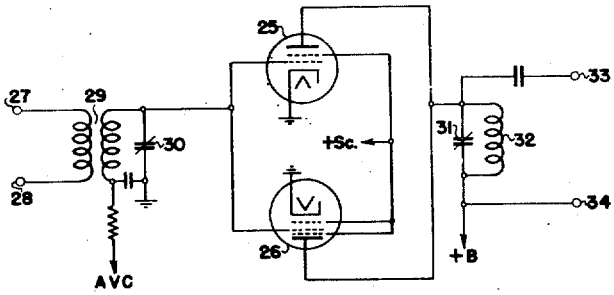

The novel features which are believed to be characteristic of the invention are set forth with particularity in the appended claims. The invention itself, however, both as to its organization and method of operation, together with other and further advantages thereof, will best be understood by reference to the following specification taken in connection with the accompanying drawings, in which Fig. 1 is a simplified circuit diagram utilized to derive the input conductance characteristic of a conventional vacuum tube circuit; Fig. 2 is a fragmentary view of the basic electrode structure of a tube providing a negative input conductance; Figs. 3 and 4 are input conductance graphs of a tube having the electrode structure of Fig. 2 and of a conventional vacuum tube, respectively; Fig. 5 is a circuit diagram of a high-frequency signal-translating stage in accordance with the invention utilizing two vacuum tubes; and Figs. 7, 9 and 11 illustrate high-frequency signal-translating stages in accordance with the invention utilizing the unitary tube structures of Figs. 6, 8, and 10, respectively.

The input conductance of conventional vacuum tubes is caused by three factors: (1) the dielectric losses of the tube insulators and the tube base; (2) feedback between the cathode and grid circuits through the grid-cathode capacitance of the tube and the self-inductance of the cathode lead, the latter being common to the output and input circuits; and (3) the transit time of electrons through the tube. The input conductance caused by dielectric losses is usually small compared to that caused by feedback through the grid-cathode capacitance and the self-inductance of the cathode lead and also is small as compared to that component of input conductance dependent on the transit time of electrons through the tube.

In order to derive an expression for the input conductance caused by feedback between the input and output circuits of a high-frequency signal-translating stage utilizing a conventional vacuum tube, reference is made to Fig. 1. Fig. 1 comprises a high-frequency signal-translating stage including a vacuum tube 10, input terminals 11, 12 and output terminals 13, 14. The grid-cathode capacitance of tube 10 is represented by condenser 15, while the inductance of the cathode lead is represented by inductance 16. The impedance of the output circuit is represented schematically by impedance 17 connected across output terminals 13, 14.

If V is the voltage applied to the input terminals 11, 12 and $i$ the input current which flows because of this voltage, the following equations are obtained neglecting the components of input conductance due to dielectric losses and to transit time of the tube:

$$V=i(1/j_\omega C_{15}+j_\omega L_{16})-i_k j_\omega L_{16} \qquad (1)$$

where $i_k$ is the cathode current and $\omega$ is the angular frequency.

$$i_k=-g_k V_g=-g_k i/j_\omega C_{15} \qquad (2)$$

where $V_g$ is grid-cathode voltage and $g_k$ is the change in cathode current for a change in grid voltage. Therefore $$V=i(1/j_\omega C_{15}+j_\omega L_{16}+g_k j_\omega L_{16}/j_\omega C_{15}) \qquad (3)$$

As the cathode-lead inductance of conventional tubes is usually of the order of 0.04 microhenry, while the grid-cathode capacitance of such tubes is of the order of 7 micromicrofarads, the resonant frequency of these two reactances is about 300 megacycles. Therefore, for frequencies up to 100 megacycles $\omega L_{16}$ is small compared to $1/\omega C_{15}$ and the former may be neglected. The input admittance Y of the tube may then be expressed as:

$$Y=i/V=j\omega C_{15}/(1+g_k j\omega L_{16} \qquad (4)$$

Or if rationalized and the term $(g_k \omega L_{16})^2$ in the denominator is neglected $$Y\cong j_\omega C_{15}+\omega^2 g_k L_{16} C_{15}$$

From Equation 4 the expression for the component of input conductance $G_f$ due to feedback through the grid-cathode capacitance and the inductance of the cathode lead is found to be:

$$G_f=\omega^2 g_k L_{16} C_{15} \qquad (5)$$

The component of input conductance of a conventional vacuum tube dependent on the transit of electrons through the tube, has been obtained mathematically by D. O. North (see Proceedings of the Institute of Radio Engineers, volume 24, No. 1, January 1936, page 108 et seq.). A mechanical explanation of the effect of the transit time of electrons on the input conductance of a vacuum tube has been developed by W. R. Ferris (see Proceedings of the Institute of Radio Engineers, volume 24, No. 1, January 1936, page 82 et seq.). These authors have shown that the component of input conductance $G_t$ of conventional vacuum tubes dependent on the transit time of electrons through the tube is:

$$G_t=F\omega^2 g_k \qquad (6)$$

where F is a function of the transit time. It will be noted that Equations 5 and 6 are of similar form and for this reason it is difficult experimentally to evaluate $G_t$ and $G_f$ separately. Calculations indicate that they are of comparable magnitude for conventional tubes.

Certain vacuum tube structures under certain operating potentials exhibit a negative input conductance. The essential tube requirements for this phenomenon to occur is a control electrode slightly negative with respect to its associated cathode interposed between two electrodes of positive potential. This basic tube structure for a tube having co-axial electrodes, is represented by the fragmentary view of Fig. 2, wherein a control electrode 20, associated with a cathode 21, is shown interposed between an accelerating or space-charge grid electrode 22 and an anode 23. Experiments with a type of tube equivalent to that of Fig. 2, wherein the first or accelerating grid 22 was connected to a source of potential of +50 volts, and the anode operated at a potential of +200 voltage, showed that a negative conductance of several micromhos obtained between the grid 20 and the cathode at 6 megacycles with the grid 20 biased to −3 volts. Further, this negative conductance decreased with increasing negative bias on the grid 20. The grid conductance bias characteristic of such a tube is shown in Fig. 3 while the corresponding characteristic of a conventional vacuum tube conventionally connected in a signal-translating stage is shown in Fig. 4.

It has also been determined experimentally that the negative input conductance of a vacuum tube, as represented by the characteristic of Fig. 3, varies somewhere between the 1.5 and 2.0 power of the operating frequency. This, of course, is nearly the same law of variation as that of the positive input conductance of conventional tubes, as indicated by Equations 5 and 6 above. It is seen that the characteristic curves of Figs. 3 and 4 are generally similar in form but opposite in polarity. It is, therefore, proposed, in accordance with the present invention, to utilize space discharge paths in parallel having different types of characteristics and so to adjust the spacing of the electrodes and their operating potentials that the conductance characteristics of the several space paths are complementary over the operating range of the stage. The component input conductances of such a stage then tend to cancel each other. Therefore, the two types of conductance variations tend to be equal and opposite over the frequency range as well as the grid-bias range of the stage, that is, for all operating conditions of the stage.

An arrangement of the type just described is shown in Fig. 5 which comprises a conventional electron discharge device and an electron discharge device having an electrode structure including the basic form illustrated in Fig. 2 to provide a virtual cathode between its control electrode and its cathode. The high-frequency signal-translating stage of Fig. 5 comprises input terminals 27, 28 to which are coupled the primary winding of selector transformer 29, the secondary winding of which is tuned by condenser 30. The input electrodes of each of tubes 25 and 26 are connected across the selector circuit 29, 30 in a conventional manner. A tuned circuit 31, 32 is included in the common anode circuit of tubes 25, 26, while output terminals 33, 34 are coupled across tuned circuit 31, 32. Suitable operating potentials are applied to the electrodes of tubes 25, 26 from sources indicated at +Sc and +B while a suitable amplification control potential is applied to the signal input grids from a suitable source indicated at A. V. C.

In considering the operation of the stage of amplification just described, it will be seen that tube 25 has the conventional type of grid voltage-input conductance characteristic shown in Fig. 4 while tube 26 has the type of characteristic shown in Fig. 3. It is seen that these characteristics are approximately complementary over a wide range of grid-bias voltage which may be adjusted either manually or by a conventional automatic amplification control system as indicated by A. V. C. Therefore, the resultant input conductance of the high-frequency signal-translating stage is materially reduced and may, in fact, with the proper choice of tubes, be reduced substantailly to zero by the operation of tubes 25 and 26 in parallel.

Figure 6:
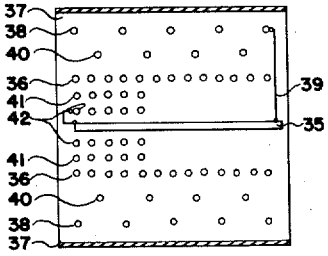
Figure 7:
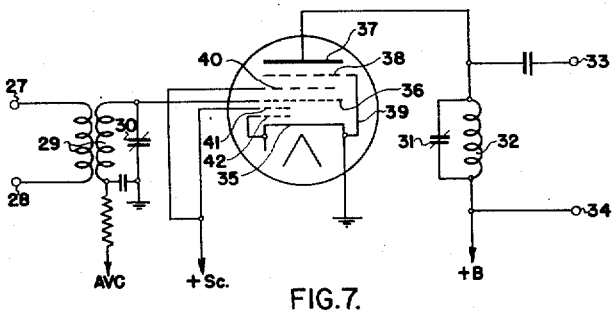

The two parallel space-discharge paths provided by tubes 25 and 26 of Fig. 5 are replaced by a single composite tube in the embodiment of the invention illustrated in Fig. 6. A signal-translating stage including the electrode structure of Fig. 6 is shown in Fig. 7. The electrode structure of Fig. 6 comprises a cathode 35, a helical control or signal input operating range and coextensive with cathode 35 and a cylindrical anode 37 coaxial with cathode 35 and electrode 36. A suppressor grid 38 connected directly to the cathode 35 by conductor 39 and a screen grid 40 is interposed between the control or signal electrode 36 and anode 37. The electrode structure which has so far been described is that of a conventional vacuum tube, with the exception that the control or signal electrode 36 is spaced from cathode 35 by a distance greater than usual, and such a structure has a positive input conductance when the tube is utilized in a normal manner.

However, a portion of the space path of the electrode structure of Fig. 6 includes also the electrode structure of Fig. 2 so that, for this portion of the tube, a virtual cathode exists adjacent the control or signal electrode 36 and between the control or signal electrode 36 and the cathode 35. The portion of the tube in which this virtual cathode is effective tends to provide a negative input conductance. In order to provide the virtual cathode an auxiliary or accelerating electrode 41, commonly known as a space-charge grid, is disposed between the control or signal electrode 36 and cathode 35 and extends along only a portion of the cathode surface so that it is effective over only a portion of the cross-sectional area of the electron stream emitted by the cathode, the auxiliary electrode 41 being adapted to be operated at a potential positive with respect to that of the cathode 35. As thus arranged, the control or signal electrode 36 is effective over a substantially larger portion of the cross-sectional area of the electron stream than is the auxiliary or accelerating electrode 41.

A second auxiliary electrode 42, axially coextensive with auxiliary or accelerating electrode 41 and connected to cathode 35, is disposed between electrode 41 and cathode 35 in order to reduce the amount of current which would otherwise be drawn by the accelerating electrode 41. It will be understood that in order to provide a suitable transconductance the control or signal electrode 36 must be located reasonably close to cathode 35 and it may be found expedient to locate only that portion of electrode 36 which is coextensive with electrodes 41 and 42 at a sufficient distance from the cathode to make room for these electrodes and place the remainder of electrode 36 in close proximity with cathode 35.

In the latter case, the control electrode 36 is adjacent the cathode 35 over only a portion of its surface and the accelerating electrode or space-charge grid 41 is adjacent the cathode over the remainder of the cathode surface.

A circuit utilizing the electrode structure of Fig. 6 to provide a stage of high-frequency amplification having very low or substantially zero input conductance is shown in Fig. 7. The circuit is generally similar to that of Fig. 5 while the electrode structure is that of Fig. 6, similar circuit elements being given reference numerals identical to those of Figs. 5 and 6. It is believed that the operation of the circuit of Fig. 7 will be apparent from the description which has been given above with reference to Fig. 5 and with reference to the electrode structure of Fig. 6, the space path including electrodes 41 and 42 corresponding to the tube 26 of Fig. 5 and the space path excluding such electrodes corresponding to the tube 25 of Fig. 5.

Figure 8:
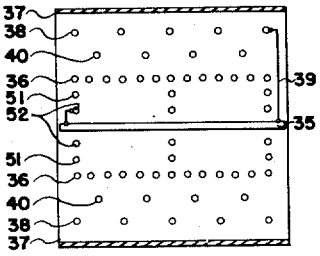
Figure 9:
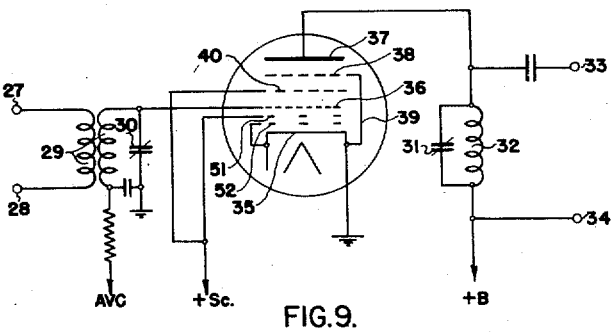

The tube structure of Fig. 8 and the circuit of Fig. 9 are generally similar to those of Figs. 6 and 7, respectively, and similar circuit elements have been given identical reference numerals. The primary difference between the tube structure of Fig. 6 and that of Fig. 8 is that auxiliary electrodes 41 and 42, the effective surfaces of which are restricted to a particular portion of cathode 35, have been replaced by electrodes 51 and 52, respectively. Electrodes 51 and 52 are each in the form of a helix, the length of which is approximately equivalent to that of cathode 35, but the pitch of which is such that there are appreciable portions of cathode 35 upon which electrodes 51 and 52 are not effective, these portions of the tube providing space discharge paths which are effective to provide a positive input conductance in the normal manner.

Figure 10:
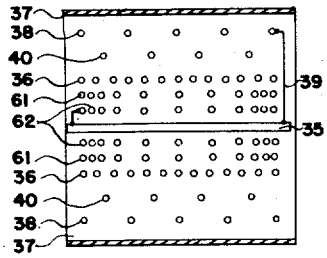
Figure 11:
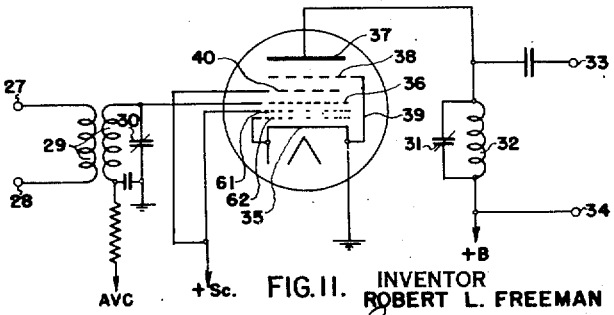

The tube structure of Fig. 10 and the circuit of Fig. 11 are identical with those of Figs. 8 and 9, respectively, except for the fact that electrodes 51 and 52 having a uniform spacing between the turns thereof have been replaced by electrodes 61 and 62, respectively, each of which forms a helix having a variable pitch.

While there have been described what are at present considered to be the preferred embodiments of the invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A high-frequency signal-translating stage comprising vacuum-tube electrode structure effectively including a plurality of electron-discharge paths in parallel, certain of said discharge paths comprising conventional electrodes including input electrodes having appreciable positive conductance therebetween, others of said discharge paths comprising input electrodes including a control electrode, a cathode, and a positive electrode between said control electrode and said cathode, whereby a negative conductance exists between said last-mentioned input electrodes, the spacing of said electrodes and their normal operating potentials being so proportioned that said conductances are substantially equal in magnitude for all operating conditions of said stage.

2. A high-frequency signal-translating stage comprising vacuum-tube electrode structure effectively including a plurality of electron-discharge paths in parallel, certain of said discharge paths comprising conventional electrodes including input electrodes having appreciable positive conductance therebetween, others of said discharge paths comprising two electrodes and input electrodes including a control electrode disposed between said two electrodes, and means for applying a positive potential to each of said two electrodes, whereby a negative conductance exists between said last-mentioned input electrodes, the spacing of said electrodes and their normal operating potentials being so proportioned that said conductances are substantially equal in magnitude for all operating conditions of said stage.

3. A high-frequency signal-translating stage for operating over a wide range of frequencies comprising vacuum-tube electrode structure effectively including a plurality of electron-discharge paths in parallel, certain of said discharge paths comprising conventional electrodes including input electrodes having appreciable positive conductance therebetween, others of said discharge paths comprising input electrodes including a control electrode and a cathode, means for forming a virtual cathode between said control electrode and said cathode, whereby a negative transconductance exists between said last-mentioned input electrodes, the spacing of said electrodes and their normal operating potentials being so proportioned that said conductances are approximately equal in magnitude over the frequency range of said stage.

4. A high-frequency signal-translating stage comprising vacuum-tube electrode structure effectively including a plurality of electron-discharge paths in parallel, certain of said discharge paths comprising conventional electrodes including input electrodes having appreciable positive conductance therebetween, others of said discharge paths comprising input electrodes including a control electrode, a cathode, and a positive electrode between said control electrode and said cathode, whereby a negative conductance exists between said last-mentioned input electrodes, said input electrodes being adapted to be operated over a wide range of bias potentials, the spacing of said electrodes and their normal operating potentials being so proportioned that said conductances are complementary over the grid-bias range of said input electrodes.

5. A high-frequency signal-translating stage comprising vacuum-tube electrode structure effectively including a plurality of electron-discharge paths; certain of said discharge paths comprising conventional electrodes including input and output electrodes and having appreciable positive conductance between said input electrodes; others of said discharge paths comprising two electrodes, input electrodes including a control electrode disposed between said two electrodes, and output electrodes; means for applying a positive potential to each of said two electrodes, whereby a negative transconductance exists between said last-mentioned input electrodes; said two sets of input electrodes and said two sets of output electrodes being respectively coupled in parallel in said stage; and the spacing of said electrodes and their normal operating potentials being so proportioned that said conductances are substantially equal in magnitude for all operating conditions of said stage.

6. A high-frequency signal-translating stage comprising vacuum-tube electrode structure effectively including a plurality of electron discharge paths in parallel, certain of said discharge paths comprising conventional electrodes including a cathode and a control electrode having an appreciable positive conductance therebetween, others of said discharge paths including two electrodes, a cathode, and a control electrode disposed between said two electrodes, means for applying a positive potential to each of said two electrodes, means for biasing each of said control electrodes negatively with respect to its associated cathode, whereby a negative conductance exists between said last-mentioned input electrodes, the spacing of said electrodes and their normal operating potentials being so proportioned that said conductances are substantially equal in magnitude for all operating conditions of said stage.

7. A high-frequency signal-translating stage comprising vacuum-tube electrode structure effectively including a plurality of electron-discharge paths in parallel, certain of said discharge paths comprising conventional electrodes including input electrodes having an appreciable positive conductance therebetween, others of said discharge paths comprising two electrodes and input electrdoes including a control electrode disposed between said two electrodes, means for applying a positive potential to each of said two electrodes, whereby a negative conductance exists between said last-mentioned input electrodes, the spacing of said electrodes and their normal operating potentials being so proportioned that said conductances are approximately equal in magnitude, whereby said conductances vary as substantially the same function of frequency over the operating range of said stage and the effective input conductance to said stage is substantially zero over said operating range.

8. A high-frequency signal-translating stage comprising vacuum-tube electrode structure effectively including a plurality of electron-discharge paths in parallel, certain of said discharge paths comprising conventional electrodes including input electrodes having appreciable positive conductance therebetween, others of said discharge paths comprising two electrodes and input electrodes including a control electrode disposed between said two electrodes, means for applying a positive potential to each of said two electrodes whereby a negative conductance exists between said last-mentioned input electrodes, the spacing of said electrodes and their normal operating potentials being so proportioned that said conductances are approximately equal in magnitude, whereby said conductances vary between the limits of 1.5 and 2.0 power of the frequency over the operating range of said stage and the effective input conductance to said stage is substantially zero over said operating range.

9. A high-frequency signal-translating stage comprising vacuum-tube electrode structure effectively including a plurality of electron-discharge paths in parallel, certain of said discharge paths comprising conventional electrodes including input electrodes having an appreciable positive conductance therebetween, others of said discharge paths comprising two electrodes and input electrodes including a control electrode disposed between said two electrodes, means for applying a positive potential to each of said two electrodes, whereby a negative conductance exists between said last-mentioned input electrodes, said input electrodes being operable over a wide range of bias voltages, the spacing of said electrodes and their normal operating potentials being so proportioned that said conductances vary substantially as the same function of said bias voltages over the operating range of said stage, whereby the effective input conductance to said stage is substantially zero over said operating range.

10. A high-frequency signal-translating stage comprising a single vacuum-tube electrode structure effectively including a plurality of electron-discharge paths in parallel, certain of said discharge paths comprising conventional electrodes including input electrodes having an appreciable positive conductance therebetween, others of said discharge paths comprising a cathode and a control electrode, means for forming a virtual cathode between said cathode and said control electrode, whereby a negative conductance exists between said cathode and said control electrode, the spacing of said electrodes and their normal operating potentials being so proportioned that said conductances are substantially equal in magnitude for all operating conditions of said stage.

11. A high-frequency signal-translating stage comprising a single vacuum-tube electrode structure effectively including a plurality of electron-discharge paths in parallel, certain of said paths comprising conventional electrodes including input electrodes having an appreciable positive conductance therebetween, others of said discharge paths comprising two electrodes and input electrodes including a control electrode disposed between said two electrodes, and means for applying a positive potential to each of said two electrodes, whereby a negative conductance exists between said last-mentioned input electrodes, the spacing of said electrodes and their normal operating potentials being so proportioned that said conductances are substantially equal in magnitude for all operating conditions of said stage.

12. A high-frequency signal-translating stage comprising a single vacuum-tube electrode structure effectively including a plurality of electron-discharge paths in parallel, said discharge paths comprising a common cathode, certain of said discharge paths comprising conventional electrodes including input electrodes comprising a control electrode, said input electrodes having appreciable positive conductance therebetween, others of said discharge paths comprising two electrodes and input electrodes including a cathode and said control electrode, said control electrode being spaced between said two electrodes and the one of said two electrodes between said control electrode and said cathode having an effective area which is appreciably smaller than said control electrode, thereby being effective only upon said others of said discharge paths, means for applying a positive potential to each of said two electrodes, whereby a negative conductance exists between said last-mentioned input electrodes, the spacing of said electrodes and their normal operating potentials being so proportioned that said conductances are substantially equal in magnitude for all operating conditions of said stage.

13. An electron discharge device having a cathode for providing a stream of electrons and an anode for receiving said electrons, an accelerating electrode near said cathode and between said cathode and anode effective over only a portion of the cross-sectional area of said electron stream, and a signal electrode positioned between said accelerating electrode and said anode over said portion of the cross-sectional area of said electron stream and positioned next to said cathode over another portion of the cross-sectional area of said electron stream.

14. An electron discharge device having a cathode for providing a stream of electrons and an anode for receiving said electrons, an accelerating electrode near said cathode and between said cathode and anode effective over only a portion of the cross-sectional area of said electron stream, a signal electrode positioned between said accelerating electrode and said anode over said portion of the cross-sectional area of said electron stream and positioned next to said cathode over another portion of the cross-sectional area of said electron stream, and a screen grid positioned between said signal electrode and the anode.

15. An electron discharge device having a cathode and a coaxial anode surrounding said cathode, a space-charge grid adjacent said cathode but extending along only a portion of the cathode surface, and a control electrode surrounding said cathode and space-charge grid and coextensive with the cathode surface and positioned between said space-charge grid and said anode over said portion of said cathode surface and positioned next to said cathode over the remaining portion of said cathode surface.

16. An electron discharge device having a cathode and an anode, a space-charge electrode adjacent to said cathode effective only over a portion of the surface of the cathode, and a signal electrode coextensive with said cathode and positioned between said space-charge grid and said anode over said portion of said cathode surface and positioned next to said cathode over the remaining portion of said cathode surface.

17. An electron discharge device having a cathode and a coaxial anode surrounding said cathode and a space-charge grid positioned adjacent to said cathode but extending over only a portion of the cathode surface, and a control grid surrounding said cathode and space-charge grid and positioned between said space-charge grid and said anode over said portion of said cathode surface and positioned next to said cathode over another portion of said cathode surface, and a screen grid positioned between said control grid and said anode.

18. An electron discharge device having a cathode and a coaxial anode surrounding said cathode and a space-charge grid positioned adjacent to said cathode but extending over only a portion of the cathode surface, a control grid surrounding said cathode and space-charge grid and positioned between said space-charge grid and said anode over said portion of said cathode surface, and a screen grid positioned between the control grid and the anode, said control grid being formed to have a portion lying next to that portion of the cathode not covered by said space-charge grid.

19. An electron discharge device having a cathode, a space-charge grid, control grid and anode, said space-charge grid and control grid being so formed that the control grid is next to the cathode over only a portion of its surface and the space-charge grid is adjacent the cathode over the remainder of the cathode surface.

20. An electron discharge device having a cathode and an anode and control means positioned between the cathode and the anode, an input circuit and connections between the input circuit and said control means for applying potentials from said input circuit on said control means, said control means undesirably absorbing power from said input circuit, and means within said device for causing part of said control means additionally to deliver power to said input circuit.

21. A circuit including a first electron discharge device having a cathode, control grid and anode, and a second electron discharge device having a cathode, space-charge grid, control grid and anode, an input circuit connected between the control grid and cathode of the first electron discharge device, said last-mentioned control grid undesirably absorbing power from said input circuit, an output circuit connected to the anode and cathode of the second electron discharge device, a pair of direct electrical connections one between the two control grids and one between the two cathodes of said electron discharge devices, and means for applying a positive unidirectional potential to said space-charge grid to cause the control grid of said second discharge device to deliver power to said input circuit.

22. A circuit including a first electron discharge device having a cathode, control grid, screen grid and anode, and a second electron discharge device having a cathode, space-charge grid, control grid and anode, an input circuit connected between the cathode and control grid of the first electron discharge device, said last-mentioned control grid undesirably absorbing power from said input circuit, an output circuit connected between the anode and cathode of the second electron discharge device, a plurality of direct electrical connections, one between the control grids, one between the cathodes, and one between the anodes of said electron discharge devices, and means for applying a positive unidirectional potential to said space-charge grid to cause the control grid of said second discharge device to deliver power to said input circuit.

23. An electron discharge device having a cathode and an anode and two control electrode portions positioned between said cathode and said anode, an input circuit and connections between said input circuit and said control electrode portions for applying potentials from said input circuit simultaneously on said control electrode portions, one of said electrode portions undesirably absorbing power from said input circuit, and means within said device for causing the other of said control electrode portions to deliver power to said input circuit, each of said control electrode portions operating on electrons originating from different parts of the surface of said cathode.

24. An electron discharge device having a cathode, an anode, a space-charge grid adjacent to said cathode but extending along only a portion of the cathode surface, and a control electrode coextensive with the cathode surface and positioned between said space-charge grid and said anode over said portion of said cathode surface and positioned next to said cathode over another portion of said cathode surface.

25. An electron discharge device having a cathode, an anode, a space-charge grid positioned adjacent to said cathode and extending over only a portion of the cathode surface, a control grid positioned between said space-charge grid and said anode over said portion of said cathode surface and positioned next to said cathode over another portion of said cathode surface, and a screen grid positioned between said control grid and said anode.

ROBERT L. FREEMAN.